United States Patent [19]
Furuta

[11] Patent Number: 6,031,384
[45] Date of Patent: Feb. 29, 2000

[54] IC TESTING METHOD AND APPARATUS

[75] Inventor: Katsunobu Furuta, Gyoda, Japan

[73] Assignee: Advantest Corporation, Tokyo, Japan

[21] Appl. No.: 08/995,919

[22] Filed: Dec. 22, 1997

[30] Foreign Application Priority Data

Dec. 25, 1996 [JP] Japan ................................. 8-345225

[51] Int. Cl.⁷ .................................................. G01R 31/02
[52] U.S. Cl. ........................ 324/760; 324/755; 324/754
[58] Field of Search ..................................... 324/760, 754, 324/755, 765, 158.1

[56] References Cited

U.S. PATENT DOCUMENTS

| | | | |
|---|---|---|---|
| 5,172,049 | 12/1992 | Kiyokawa et al. .................... | 324/760 |
| 5,470,392 | 11/1995 | Yamada et al. ....................... | 134/2 |
| 5,650,732 | 7/1997 | Sakai .................................... | 324/755 |
| 5,865,319 | 2/1999 | Okuda et al. ......................... | 209/574 |

FOREIGN PATENT DOCUMENTS

| | | |
|---|---|---|
| 196 44 509 A1 | 4/1997 | Germany . |
| 9-030641A | 2/1997 | Japan . |

Primary Examiner—Josie Ballato
Assistant Examiner—T. R. Sundaram
Attorney, Agent, or Firm—Staas & Halsey LLP

[57] ABSTRACT

Two contact heads are used to convey IC devices between an IC device testing part E and a contact arm operating stage ST3 and a buffer stage ST4 is interposed between the contact arm operating stage ST3, a loader arm operating stage ST1 and an unloader arm operating stage ST2 and is movable in X-direction. On the buffer stage ST2 are disposed a loader buffer carrier and an unloader buffer carrier, the former transfers untested IC devices from the loader arm operating stage ST1 to the contact arm operating stage ST3 and the latter transfers tested IC devices from the contact arm operating stage ST3 to the unloader arm operating stage ST3.

11 Claims, 16 Drawing Sheets

IC TESTING METHOD AND APPARATUS

BACKGROUND OF THE INVENTION

1. Field of the Invention

The present invention relates generally to an IC testing method and apparatus and, more particularly, to an IC testing method and apparatus according to which a handler in a loader arm operating stage carries only yet-to-be untested devices (hereinafter referred to as untested devices) and a handler in an unloader arm operating stage carries only tested devices.

2. Description of the Related Art

A prior art example will hereinbelow be described with reference to FIGS. 1 and 2. FIGS. 1 and 2 are conceptual diagrams for explaining the path over which untested devices 19 are brought from a loader arm operating stage ST1 to an unloader arm operating stage ST2 through a loader buffer operating stage ST4, a contact arm operating stage ST3 and an unloader buffer operating stage ST5. FIG. 1 is a plan view and FIG. 2 a side view.

In FIGS. 1 and 2 the untested devices 19 are housed in a tray 11. A loader arm 10 placed in the loader arm operating stage ST1 has pick-and-place equipment 13 at its lower end. Reference numeral 1Z denotes a Z-direction loader carrier rail that is driven vertically. The pick-and-place equipment 13 is secured to the Z-direction loader carrier rail 1Z through the loader arm 10, and hence it is also driven vertically. Reference numeral 1Y denotes a Y-direction loader carrier rail that is driven longitudinally. The Z-direction loader carrier rail 1Z is mounted slidably on the Y-direction loader carrier rail 1Y, and hence it is also driven longitudinally. Reference numeral 1X denotes an X-direction loader carrier rail that is driven transversely. The Y-direction loader carrier rail 1Y is mounted on the X-direction carrier 1x, and hence it is driven transversely. The X-, Y- and Z-direction loader carrier rails 1X, 1Y and 1Z constitute a handler of the loader arm operating stage ST1.

An unloader arm 20 placed in the unloader arm operating stage ST2 has pick-and-place equipment 23 at its lower end. Reference numeral 2Z denotes a Z-direction unloader carrier rail that is driven vertically. The pick-and-place equipment 23 is mounted slidably on the Z-direction unloader carrier rail 2Z through the unloader arm 20, and hence it is also driven vertically. Reference numeral 2Y denotes a Y-direction unloader carrier rail that is driven longitudinally. The Z-direction unloader carrier rail 2Z is mounted slidably on the Y-direction unloader carrier rail 2Y, and hence it is also driven longitudinally. Reference numeral 2X denotes an X-direction unloader carrier rail that is driven transversely. The Y-direction unloader carrier rail 2Y is mounted slidably on the X-direction unloader carrier rail 2X, and hence it is driven transversely. The X-, Y- and Z-direction unloader carrier rails 2X, 2Y and 2Z constitute a handler of the unloader arm operating stage ST2. Tested devices 29 are housed in a tested device housing tray 21.

A contact arm 30 placed in the contact arm operating stage ST3 has at its lower end a contact head H. Reference numeral 3Z denotes a Z-direction head carrier rail that is driven vertically. The contact head H is secured to the Z-direction head carrier rail 3Z through the contact arm 30, and hence it is also driven vertically. Reference numeral 3Y denotes a Y-direction head carrier rail that is driven longitudinally. The Z-direction head carrier rail 3Z is mounted slidably on the Y-direction head carrier rail 3Y, and hence it is also driven longitudinally. Reference numeral 3X denotes an X-direction head carrier rail that is driven transversely. The Y-direction head carrier rail 3Y is mounted slidably on the X-direction head carrier rail 3X, and hence it is driven transversely.

The loader buffer operating stage ST4 spans the contact arm operating stage ST3 and the loader arm operating stage ST1. Reference numeral 4Y denotes a Y-direction loader buffer carrier rail, on which a loader buffer carrier 41 to be loaded with the untested device 19 is mounted and driven longitudinally.

The unloader buffer operating stage ST5 spans the contact arm operating stage ST3 and the unloader arm operating stage ST2. Reference numeral 5Y denotes a Y-direction unloader buffer carrier rail, on which an unloader buffer carrier 51 to be loaded with the tested device 29 is mounted and driven longitudinally.

IC devices are each brought from the stage ST1 to ST2 through operations ① to ⑨ that are carried out in this order as described below.

① To begin with, the X- and Y-direction loader carrier rails 1X and 1Y are driven to bring the loader arm 10 to the position ① just above the untested device housing tray 11.

② The Z-direction loader carrier rail 1Z is driven to bring the pick and place equipment 13 down to the untested device 19 to pick it up by suction.

③ The X-, Y- and Z-direction loader carrier rails 1X, 1Y and 1Z are driven to bring the loader arm 10 to the position just above the loader buffer 41 while holding the untested device by the pick-and- place equipment 13. Then the pick-and-place equipment 13 is deactivated to unload therefrom the untested device 19 onto the loader buffer carrier 41. Following this, the Y-direction loader buffer carrier rail 4Y is driven to convey the loader buffer 41 loaded with the untested device 19 from the loader arm operating stage ST1 to the contact arm operating stage ST3.

④ In the contact arm operating stage ST3, the X-, Y and Z-direction head carrier rails 3X, 3Y and 3z are driven to bring the contact arm 30 to the position of the conveyed loader buffer carrier 41. Then the contact head H is activated to pick up the untested device 19 from the loader buffer carrier 41 by suction.

⑤ The X-, Y- and Z-direction head carrier rails 3X, 3Y and 3Z are driven to bring the contact arm 30 to the position just above a device testing part E while holding the untested device 19 by the contact head H. Then the contact head H is deactivated to place the untested device 19 at a predetermined position in the device testing part E for testing.

⑥ The X-, Y- and Z-direction head carrier rails 3X, 3Y and 3Z are driven to bring the contact arm 30 to the testing part E. Then the contact head H is activated to pick up the tested device 29 from the testing part E by suction.

⑦ The X-, Y- and Z-direction head carrier rails 3X, 3Y and 3Z are driven to bring the contact arm 30 to the position just above the unloader buffer 51 in the unloader buffer operating stage ST5 while holding the tested device 29 by the contact head H. Then the contact head H is deactivated to unload therefrom the tested device 29 onto the unloader buffer carrier 51. After this, the unloader buffer carrier 51 loaded with the tested device 29 is brought down by the Y-direction unloader buffer carrier rail 5Y to the unloader arm operating stage ST2.

⑧ The X-, Y- and Z-direction unloader carrier rails 2X, 2Y and 2Z are driven to bring the unloader arm 20 to the position just above the unloader buffer carrier 51. Then the pick-and-place equipment 23 is activated to pick up the tested device 29 from the unloader buffer carrier 51 by suction.

⑨ The X-, Y- and Z-direction unloader carrier rails 2X, 2Y and 2Z are driven to bring the unloader arm 20 to the position ⑨ in a tray 21 for receiving tested devices while sorting them. Then the pick- and-place equipment 23 is deactivated to unload therefrom onto the tested device housing tray 21.

In the above prior art example, since only one contact arm 30 is used to convey the untested devices 19 to the device testing part E and convey therefrom the tested devices 29, there is no possibility of mechanical components colliding or interfering with each other during the device transfer. It is needless to say, however, that the transfer by only one contact arm 30 is less efficient than in the case of using two contact arms as described below.

Referring next to FIG. 3, a second prior art example will be described which employs two contact arms. In contrast to the example shown in FIGS. 1 and 2, the contact arm operating stage ST3 is formed by two contact arm operating stages $ST3_1$ and $ST3_2$. Each contact arm operating stage ST3 has X-, Y- and Z-direction head carrier rails 3X, 3Y and 3z for moving the contact arm 30. The contact arm operating stages $ST3_1$ and $ST3_2$ share the loader buffer operating stage ST4 joining the loader arm operating stage ST1 to the contact arm operating stage ST3 and the unloader buffer operating stage ST5 joining the contact arm operating stage ST3 to the unloader arm operating stage ST2. Hence, the both contact arm operating stages $ST3_1$ and $ST3_2$ form a contact arm operation interfering stage $ST3_{12}$ where they overlap.

The second prior art example uses two contact arms $30_1$ and $30_2$ to transfer the untested and tested devices 19 and 29. By appropriate control of the both contact arms $30_1$ and $30_2$, the transfer efficiency could be increased as compared with that in the case of using one contact arm. It is necessary, however, that a drive control unit including an electrical circuit for controlling the operation of the contact arms $30_1$ and $30_2$ be finished perfect; otherwise, the contact arms $30_1$ and $30_2$ are likely to interfere or collide with each other in the contact arm operation interfering stage $ST3_{12}$.

FIG. 4 depicts a third prior art example, which uses two contact arms $30_1$ and $30_2$ mounted on and driven by a common X-direction head carrier rail 3X. In this instance, since loader and unloader buffer units 400 and 500 both handle both untested and tested devices 19 and 29, it is occasionally impossible to judge from their appearance whether the devices being transferred are untested or tested devices while the testing system is at a standstill due to an error in the handler or handlers or by some other reason.

SUMMARY OF THE INVENTION

It is therefore an object of the present invention to provide an IC testing apparatus and method that achieve high IC device transfer efficiency and effectively avoid the occurrence of collision between contact arms.

According to the present invention, two contact heads are used to convey devices between the IC device testing part and the contact arm operating stages and a buffer stage is disposed partly extending over the contact arm operating stage, the loader arm operating stage and the unloader arm operating stage to transfer IC devices between them. The handler of the loader arm operating stage handles only untested IC devices and the handler of the unloader arm operating stage only tested IC devices.

BRIEF DESCRIPTION OF THE DRAWINGS

FIG. 10I is a diagram for explaining movements of the loader buffer carrier and the unloader buffer carrier in a ninth state;

DETAILED DESCRIPTION OF THE PREFERRED EMBODIMENTS

Figure 1:
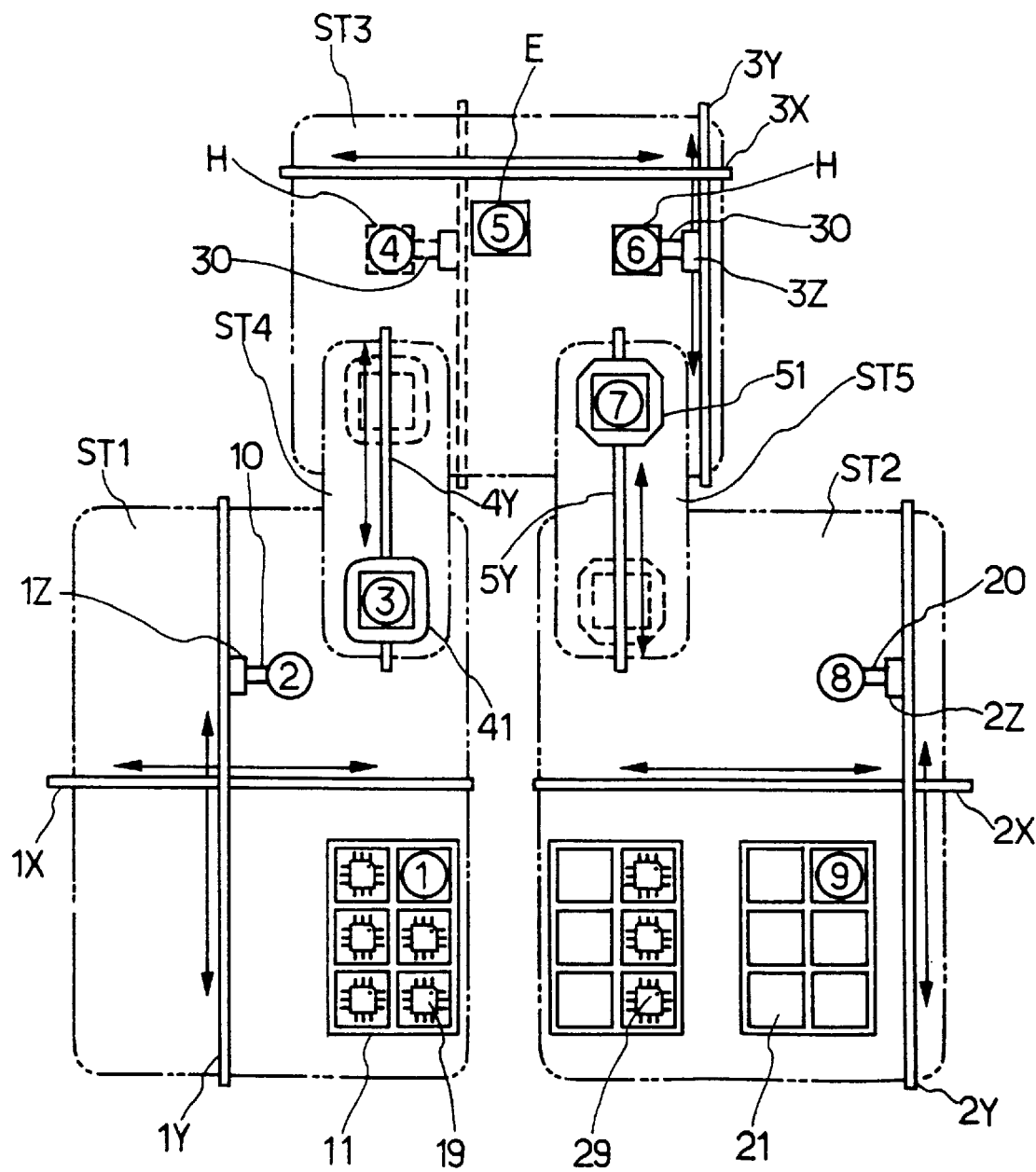
FIG. 1 is a conceptual plan view for explaining a conventional IC testing apparatus.
Figure 2:
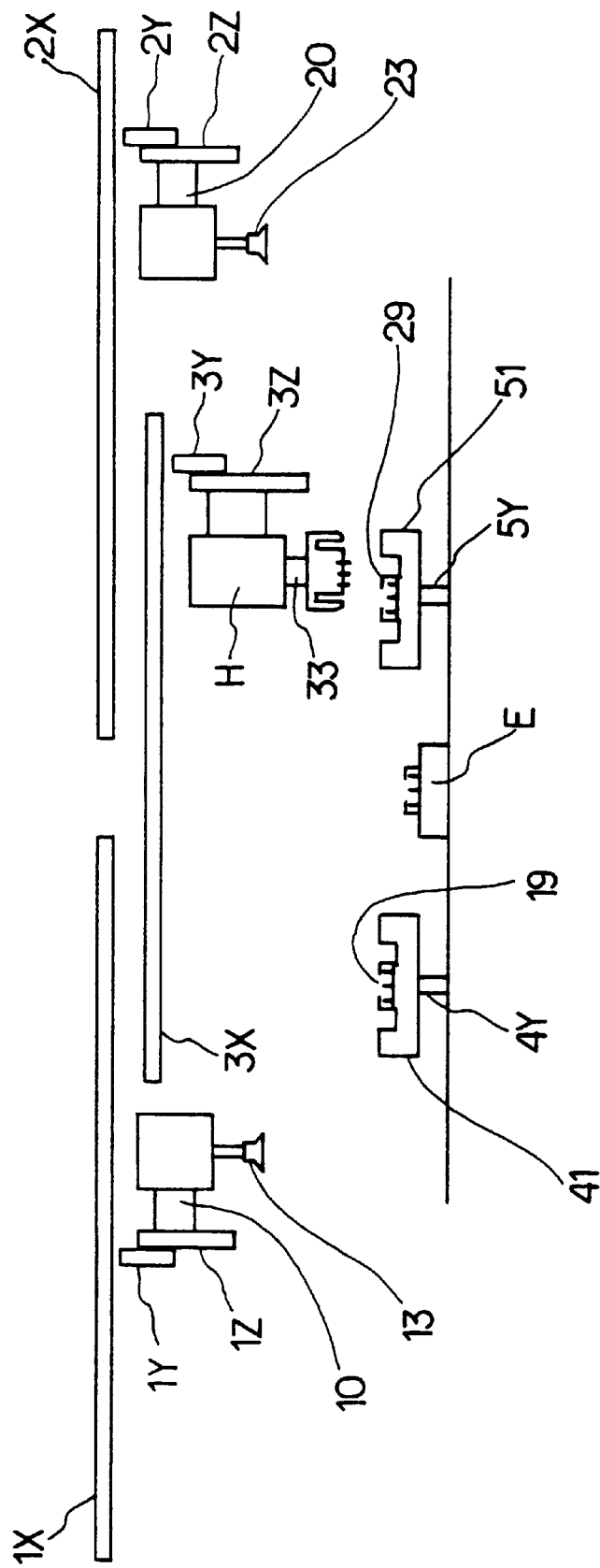
FIG. 2 is its side view.
Figure 3:
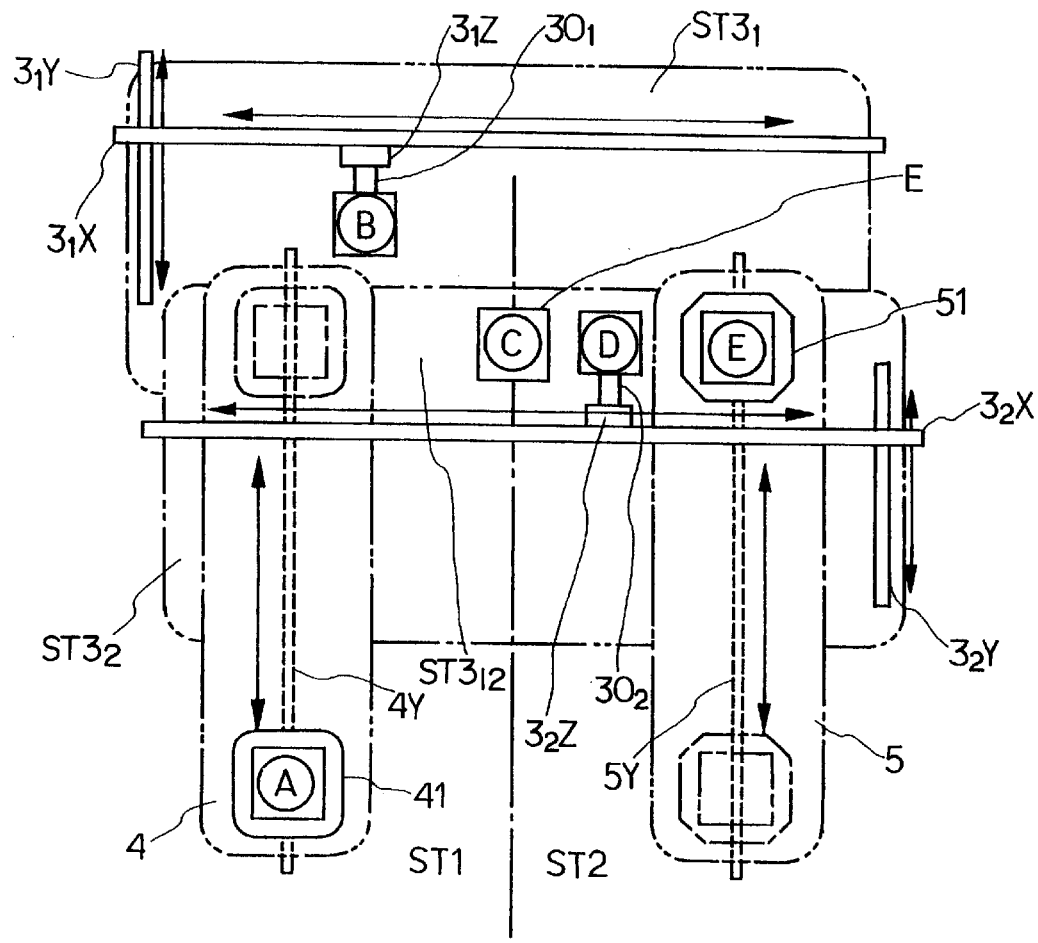
FIG. 3 is a diagram for explaining another prior art example.
Figure 4:
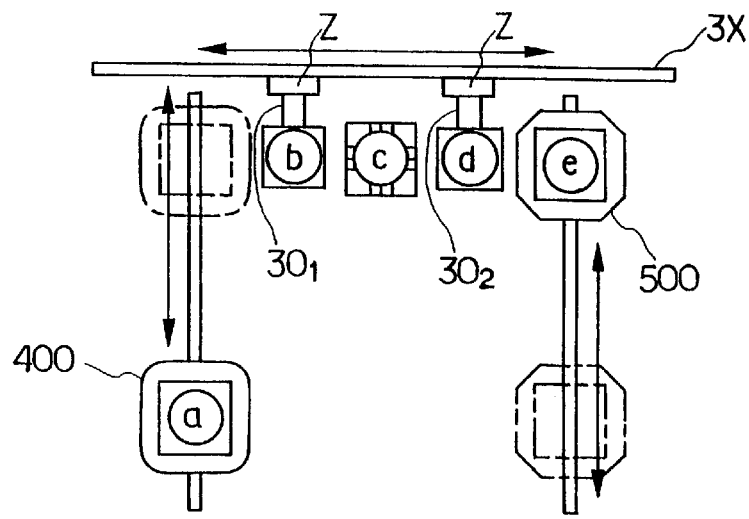
FIG. 4 is a diagram for explaining still another prior art example.
Figure 5:
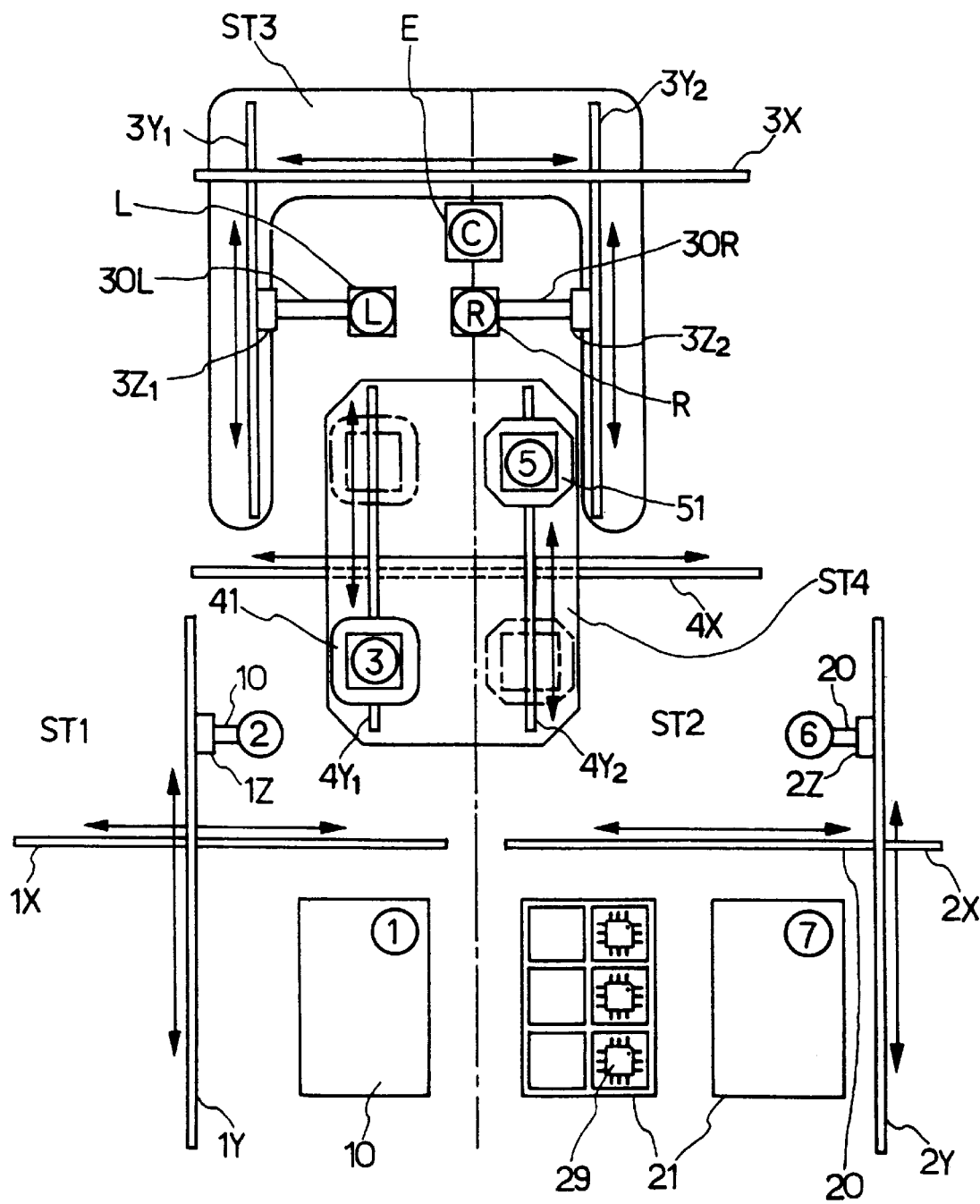
FIG. 5 is a diagram for explaining a first embodiment of the present invention.

A description will be given first, with reference to FIG. 5, of a first embodiment of the present invention. A contact arm stage ST3 has two Y-direction head carrier rails $3Y_1$ and $3Y_2$ and one X-direction head carrier rail 3X. Attached to the Y-direction head carrier rail $3Y_1$ is a Z-direction head carrier rail $3Z_1$ with a contact head L mounted thereon, which is moved in the Y direction. Attached to the Y-direction head carrier rail $3Y_2$ is a Z-direction head carrier rail $3Z_2$ with a contact head R mounted thereon, which is also moved in the Y direction. A buffer stage ST4 has two Y-direction buffer carriers $4Y_1$ and $4Y_2$. The whole structure of the buffer stage ST4 is moved on an X-direction buffer carrier rail 4X in the X direction. The loader arm operating stage ST1 and the unloader arm operating stage ST2 are identical in construction with those in FIG. 1.

Figure 6B:
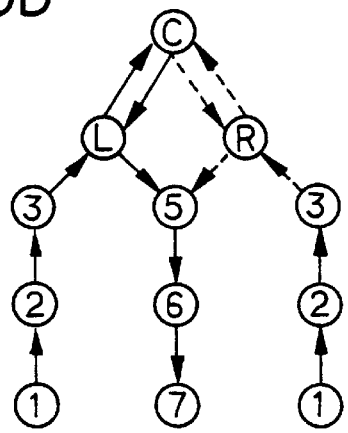
FIG. 6B is a diagram depicting the route of transfer of the IC devices in FIG. 6A.

The loader buffer carrier 41 and the unloader buffer carrier 51 are individually moved in the Y direction by the Y-direction buffer carrier rails $4Y_1$ and $4Y_2$, respectively, but they are moved in the X direction on the common X-direction buffer carrier rail 4X. The contact heads L and R are also moved individually in the Y direction by the Y-direction head carrier rails $3Y_1$ and $3Y_2$, respectively, but they are moved in the direction on the common head carrier rail 3X. The device transfer route in FIG. 5 is such as simply shown in FIGS. 6A and 6B. The device flow that is associated with the contact head L is ①→②→③→L→C→L→⑤→⑥→⑦. The device flow that is associated with the contact head R is ①→②→③→R→C→R→⑤→⑥→⑦.

Now, an explanation will be given of reference numerals that are used in common to FIGS. 7 through 9D. In this explanation, reference is made to FIG. 7 that shows the positional relationships of the loader buffer carrier 41, the unloader buffer carrier 51 and the contact heads L and R.

P1: Loading point where an untested IC device received from the loader arm 10 is loaded on the loader buffer carrier 41 and transferred to the contact head L P2: Loading point where an untested IC device received from the loader arm 10 is loaded on the loader buffer carrier 41 and transferred to the contact head R Q1: Unloading point where a tested IC device received from the contact head L is unloaded from the unloader buffer carrier 51 to the unloader arm 20

Q2: Unloading point where a tested IC device received from the contact head R is unloaded from the unloader buffer carrier 51 to the unloader arm 20

E: IC device testing part

S: Transfer point where an untested IC device conveyed from the loading point P1 by the loader buffer carrier 41 is transferred to the contact head L and a tested IC device from the IC device testing part E is transferred to the unloader buffer carrier 51

T: Transfer point where an untested IC device is conveyed from the loading point P2 by the loader buffer carrier 41 is transferred to the contact head R and a tested IC device from the IC device testing part E is transferred to the unloader buffer carrier 51

The three pairs of points P1–P2, Q1–Q2, and S–T are predetermined fixed positions on the fixed stages ST1, ST2 and ST3, respectively. In this example, distances P1–P2, P2–Q1, Q1–Q2 and S–T are chosen all equal.

Figure 8A:
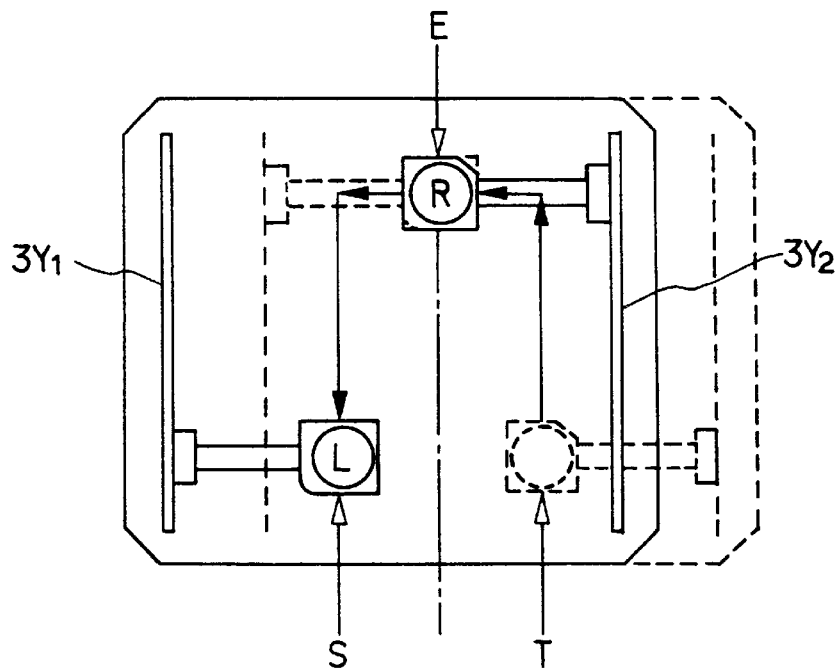
FIG. 8A is a diagram f or explaining movements of the contact heads relative to each other.
Figure 8B:
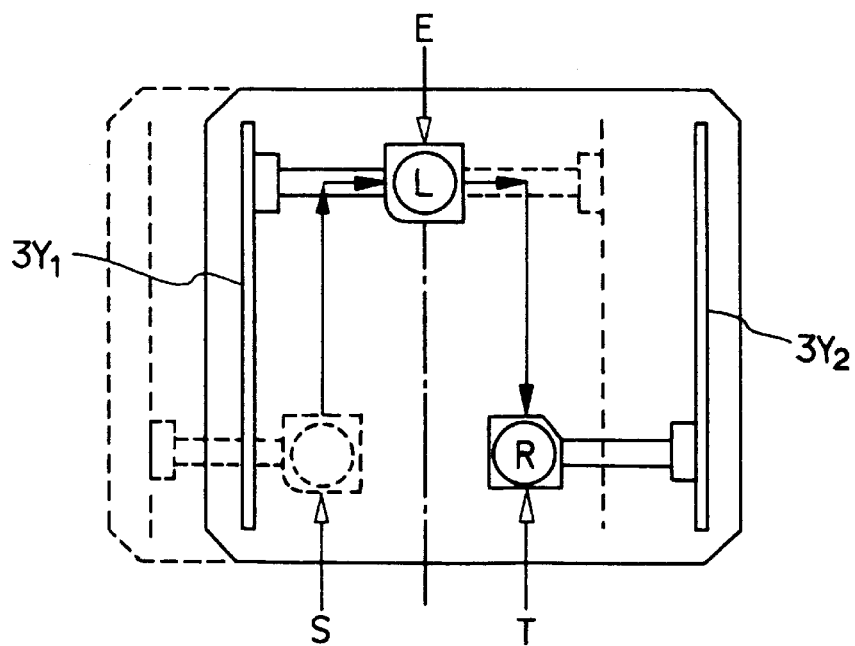
FIG. 8B is another diagram for explaining movements of the contact heads relative to each other.

FIGS. 8A and 8B are explanatory of movements of the contact heads L and R. In FIG. 8A the contact head R is brought from the point T to the device testing part E, whereas the contact head R is brought from the device testing part E to the transfer point T in synchronization with the movement of the contact head R.

FIGS. 9A through 9D are explanatory of movements of the loader buffer carrier 41 and the unloader buffer carrier 51 in the loader buffer stage ST4. In FIGS. 9A through 9D, the positions of operation of the loader buffer carrier 41 are indicated by small letters a to d and the positions of operation of the unloader buffer carrier 51 by capital letters A to D.

Figure 9A:
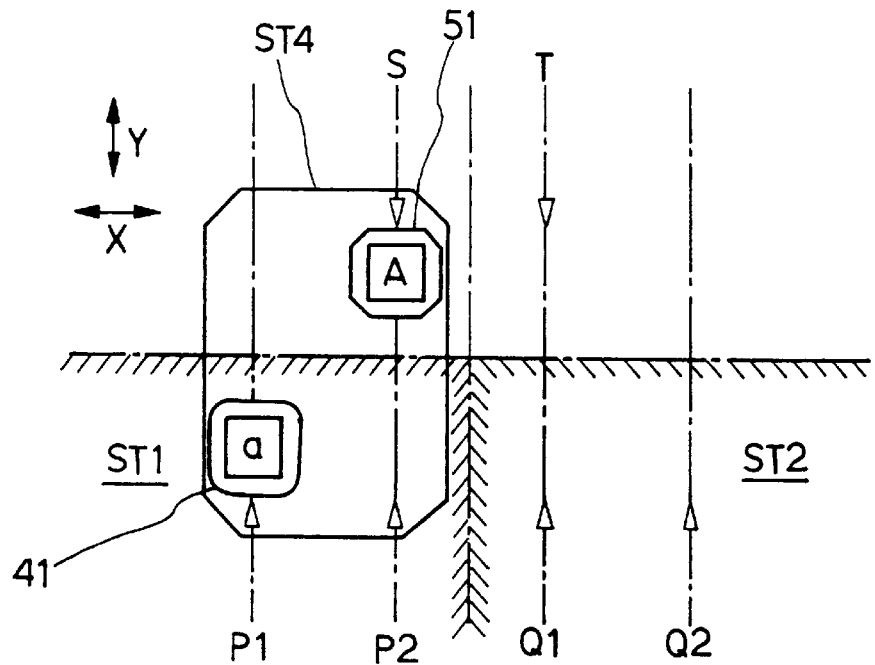
FIG. 9A is a diagram for explaining movements of the loader buffer carrier and the unloader buffer carrier in a first state.

Turning now to FIG. 9A, when the loader buffer carrier 41 (position a) receives the untested device 19 from the loader arm 10 (see also FIG. 6A) at the loading point P1, the unloader buffer carrier 51 (position A) receives the tested device 29 from the contact head L at the transfer point S. At this time, the contact head R is in the device testing part E.

Figure 6A:
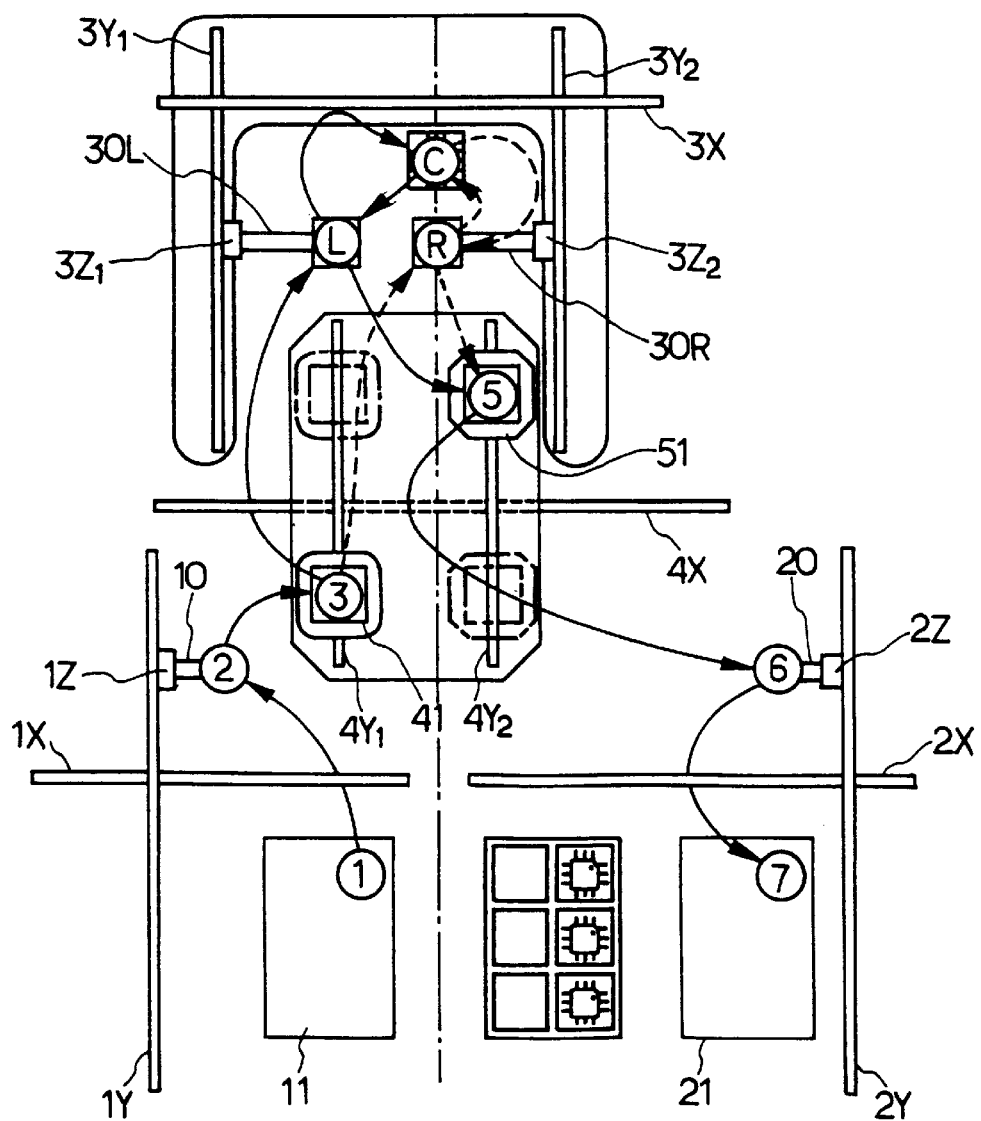
FIG. 6A is a diagram depicting an IC device transfer path in the embodiment of FIG. 5.
Figure 7:
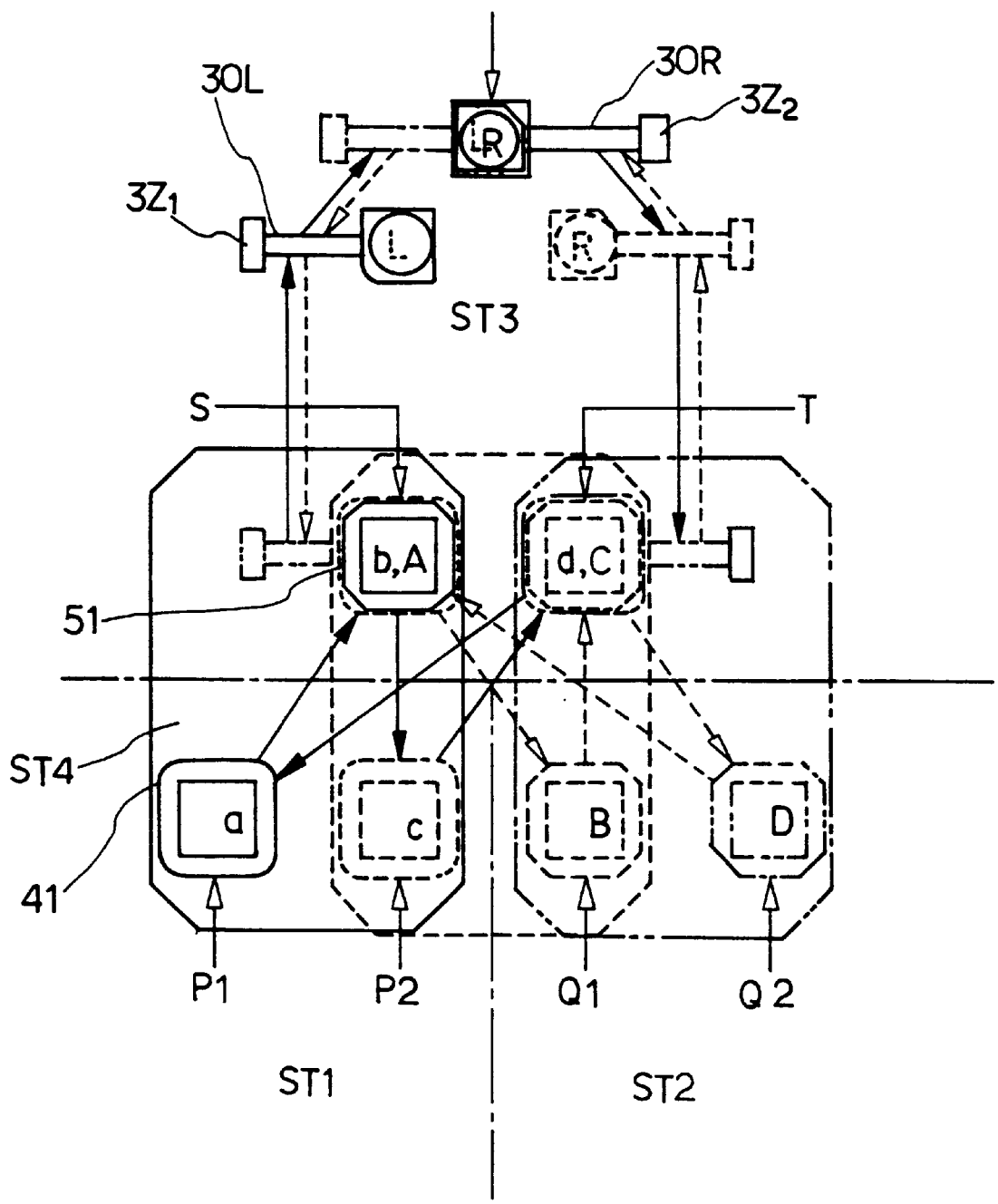
FIG. 7 is a diagram for explaining the positions of a loader buffer carrier, an unloader buffer carrier and contact heads relative to one another.
Figure 9B:
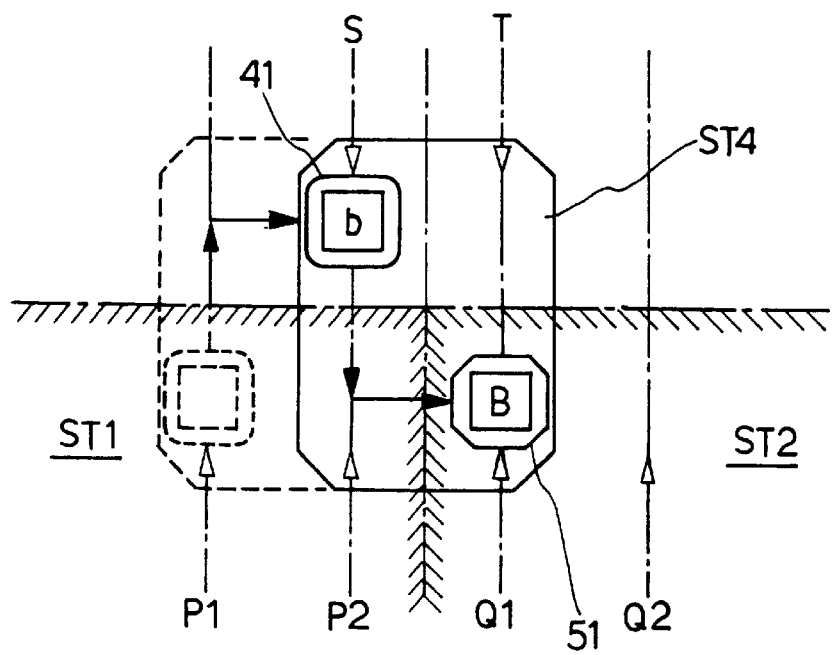
FIG. 9B is a diagram for explaining movements of the loader buffer carrier and the unloader buffer carrier in a second state.

In the transition from the FIG. 9A to the FIG. 9B state, the buffer stage ST4 shifts from the loading point P1 to P2 in the X direction, while at the same time the loader buffer carrier 41 (position b) shifts from the loading point P1 to the position b in the Y direction. The unloader buffer carrier 51 shifts from the transfer point S (position A) to the position B in the Y direction. At the transfer point S in FIG. 9B the untested device 19 is transferred from the loader buffer carrier 41 to the contact head L (see FIG. 5). At the unloading point Q1 the tested device 29 is transferred from the unloader buffer carrier 51 to the unloader arm 20 (FIG. 6A). After this, the contact head L conveys the untested device 19 to the device testing part E and the contact head R conveys the tested device 29 from the testing part E to the transfer point T. The buffer carriers 41 and 51 are brought to the positions c and C in the Y direction shown in FIG. 9C.

Figure 9C:
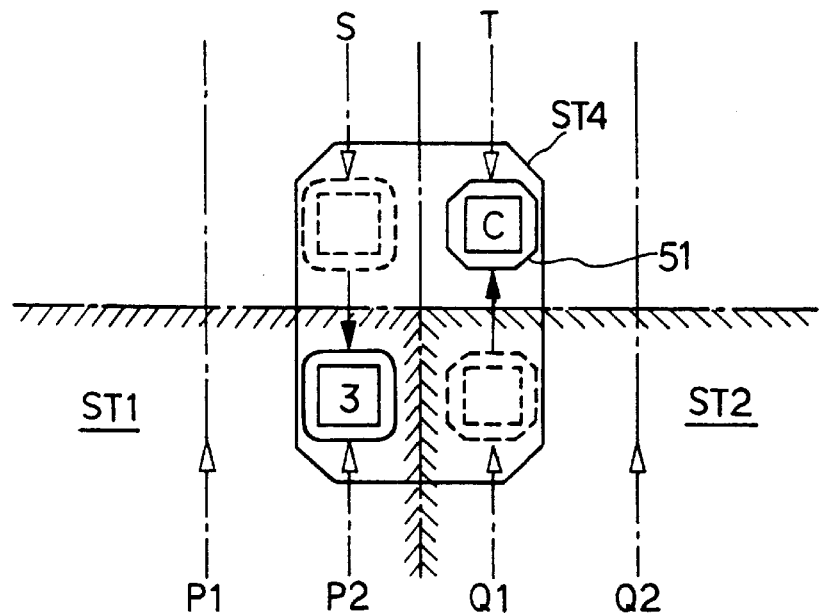
FIG. 9C is a diagram for explaining movements of the loader buffer carrier and the unloader buffer carrier in a third state.

Referring next to FIG. 9C, the tested device 29 is transferred at the transfer point T from the contact head R to the unloader buffer carrier 51 (position C). The untested device 19 is transferred at the loading point P2 from the loader arm 10 to the loader buffer carrier 41 (position c). At this time, the contact head L is still in the head testing part E. Following this, as depicted in FIG. 9D, the buffer stage ST4 shifts in the X direction, while at the time the buffer carriers 41 and 51 are brought to the positions d and D in the Y direction.

Figure 9D:
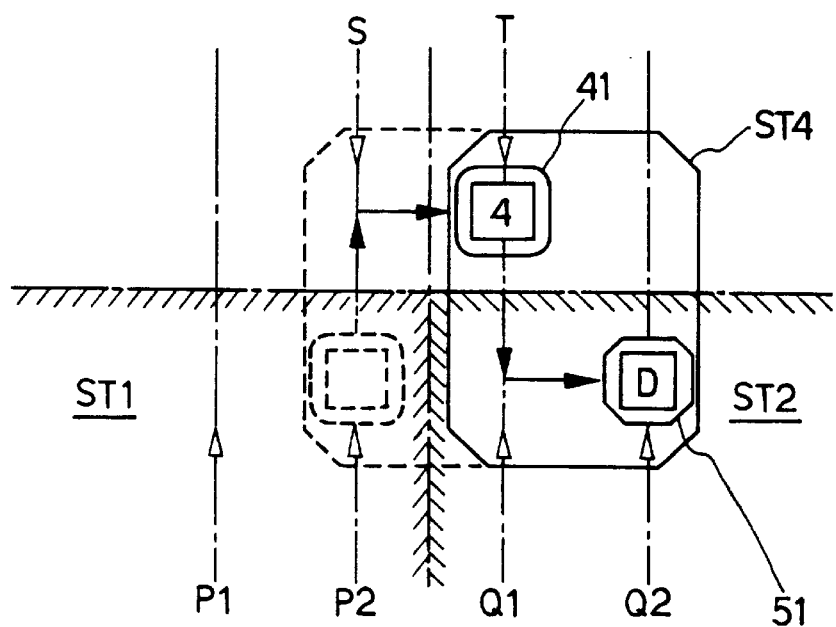
FIG. 9D is a diagram for explaining movements of the loader buffer carrier and the unloader buffer carrier in a fourth state.

Turning next to FIG. 9D, the untested device 19 is transferred at the trasfer point T from the loader buffer carrier 41 (position d) to the contact head R. The tested device 29 is transferred at the unloading point Q2 from the unloader buffer carrier 51 (position D) to the unloader arm 20. At this time, the contact head R is brought to the device testing part E, while at the same time the contact head L is brought to the transfer point S.

Thereafter, the FIG. 9D state transitions back to the FIG. 9A state. Thus the operation is back to the initial state. The IC testing is conducted in a repeating cyclic order and at the respective points P1, P2, Q1, Q2 the devices are transferred to the loader arm, the unloader arm and the contact heads L and R.

FIGS. 10A through 10I illustrate in perspective another embodiment of the present invention. While the above-described embodiment conveys IC devices one by one, the illustrated embodiment conveys a plurality of devices at one time. Referring to the perspective views depicted in FIGS. 10A through 10I will facilitate a better understanding of the movements of the buffer stage ST4, the loader buffer carrier 41, the unloader buffer carrier 51 and the contact heads L and R described previously.

Figure 10A:
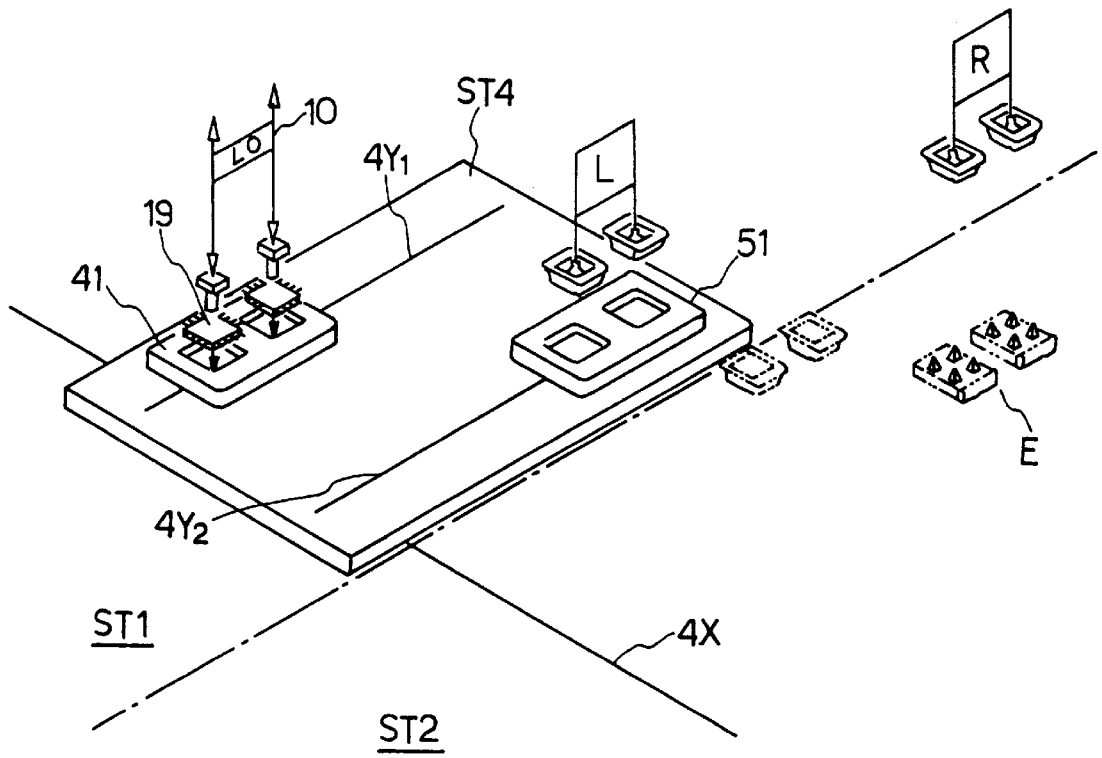
FIG. 10A is a diagram for explaining movements of the loader buffer carrier and the unloader buffer carrier in a first state in a second embodiment of the present invention.

In FIG. 10A, when the loader buffer 41 receives untested devices 19 from the loader arm 10 (see FIG. 6A), the unloader buffer carrier 51 receives tested devices 29 from the contact head L.

Figure 10B:
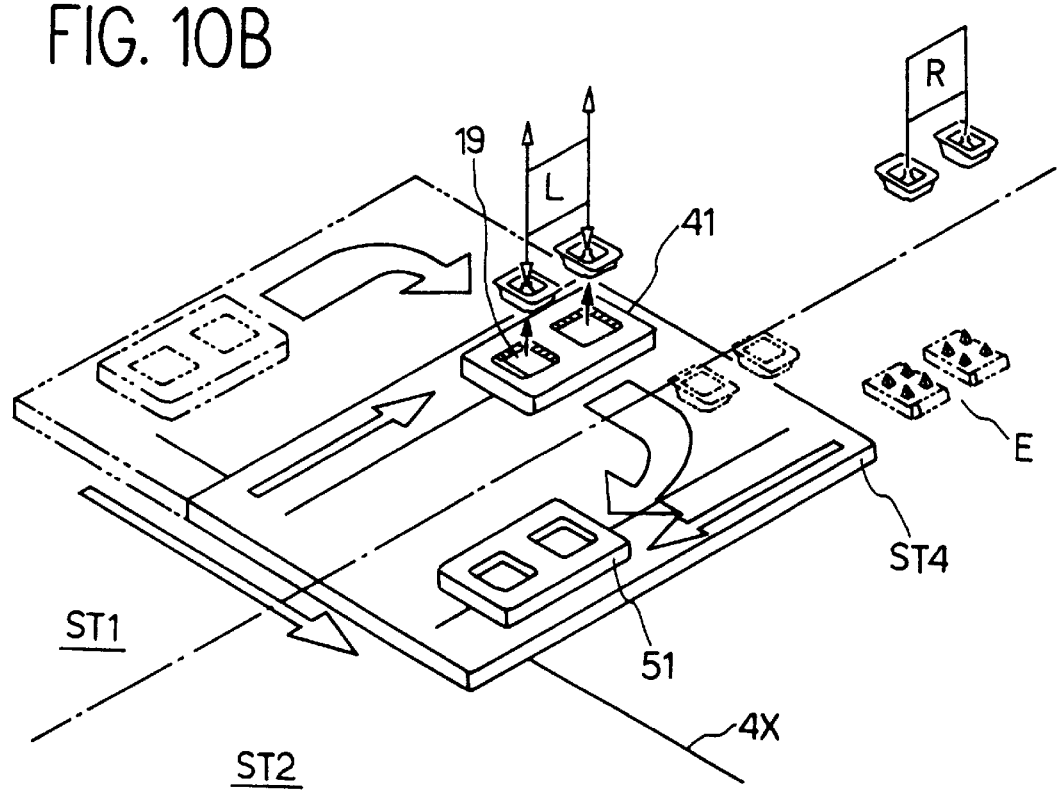
FIG. 10B is a diagram for explaining movements of the loader buffer carrier and the unloader buffer carrier in a second state.

In FIG. 10B, the buffer stage ST4 shifts one step in the +X direction, while at the same time the loader buffer carrier 41 shifts in +Y direction and the untested devices 19 held therein are transferred to the contact head L. On the other hand, the unloader buffer carrier 51 shifts in the −Y direction.

Figure 10C:
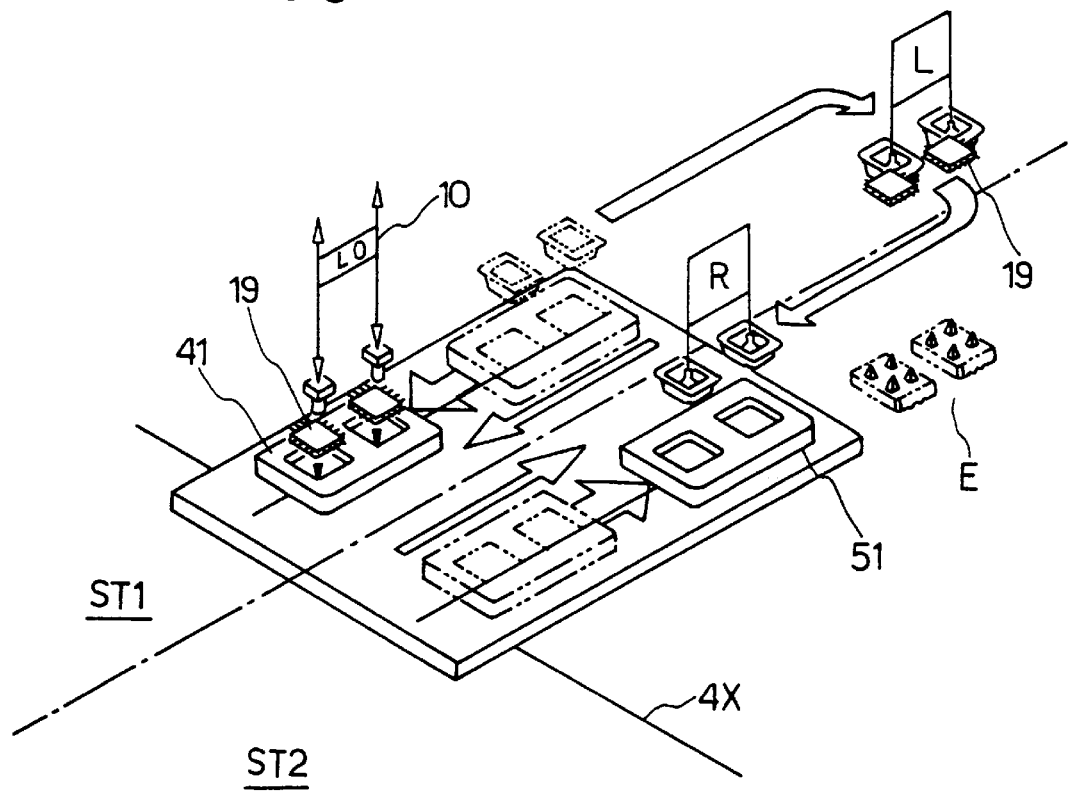
FIG. 10C is a diagram for explaining movements of the loader buffer carrier and the unloader buffer carrier in a third state.

In FIG. 10C, the buffer stage ST4 remains at the same position as in FIG. 10B and the contact head L holding the untested devices 19 shifts to the device sting part E. At the same time, the loader buffer carrier 41 shifts in the −Y direction to the original position where to receive untested devices 19 from the loader arm 10 and it receives there the next untested devices 19. On the other hand, the unloader buffer carrier 51 shifts in the +Y direction back to the position where it can receive tested devices from the contact head R, and the contact head R returns from the device testing part E to the position where to transfer tested devices to the unloader buffer carrier 51. At this time, the contact head R does not hold the tested devices 29 since the first testing is not yet conducted.

Figure 10D:
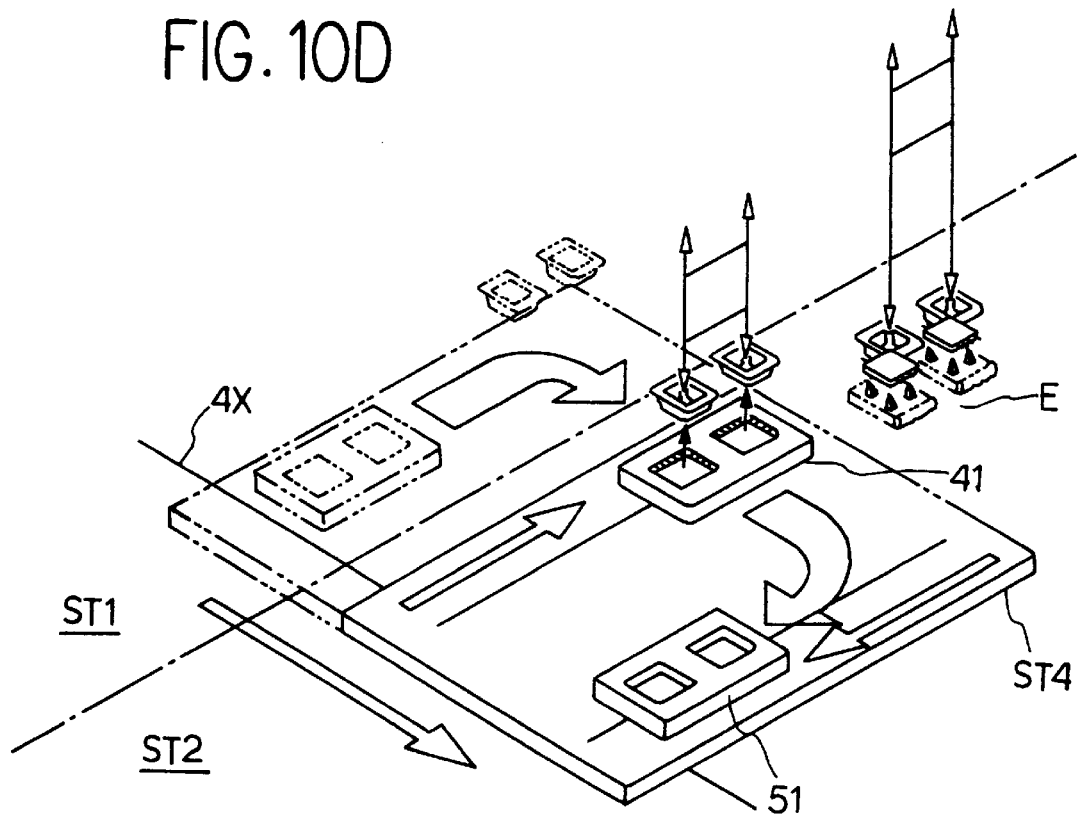
FIG. 10D is a diagram for explaining movements of the loader buffer carrier and the unloader buffer carrier in a fourth state.

In FIG. 10D, the buffer stage ST4 further shifts one step in the +X direction and the loader buffer carrier 41 shifts in the +Y direction and transfers the untested devices 19 to the contact head R. AT the same time, the contact head L places its retained untested devices 19 in the device testing part E. On the other hand, the unloader buffer carrier 51 with no devices shifts in the −Y direction.

Figure 10E:
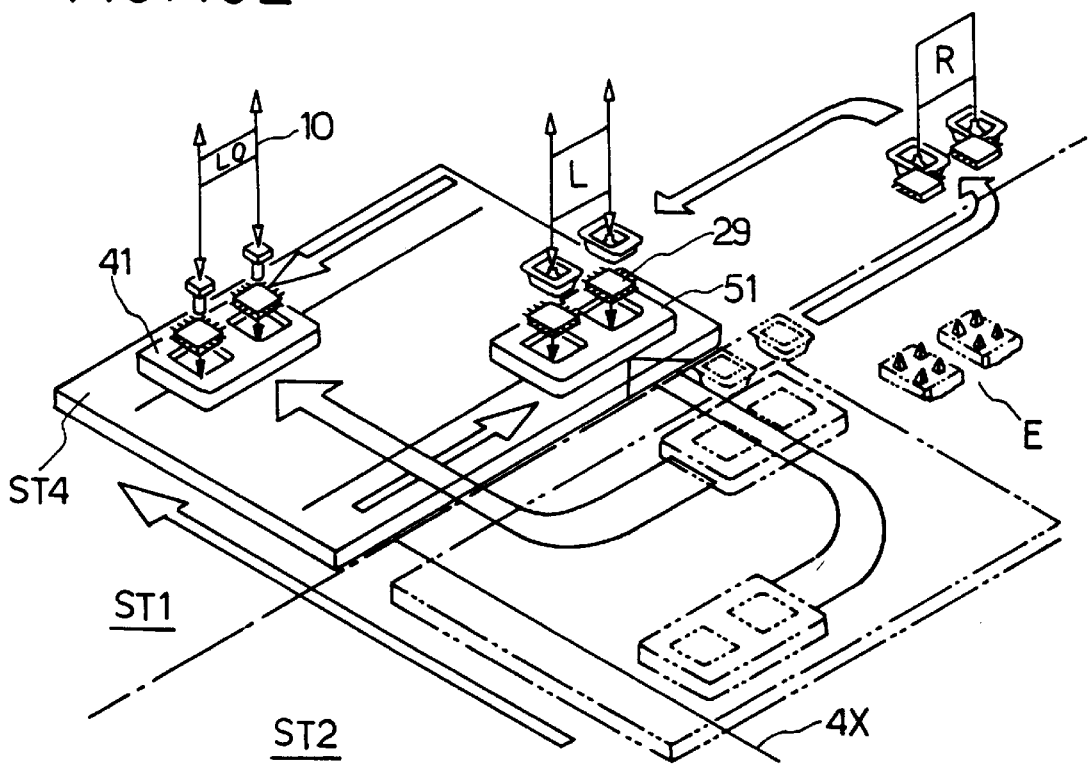
FIG. 10E is a diagram for explaining movements of the loader buffer carrier and the unloader buffer carrier in a fifth state.

In FIG. 10E, the buffer stage ST4 moves two steps in the −X direction back to the original position depicted in FIG. 10A and the loader buffer carrier 41 shifts in the −Y direction and receives untested devices 19 from the loader arm 10. On the other hand, the unloader buffer carrier 51 moves in the +Y direction back to the position where it can receive tested devices 29 from the contact head L, and the contact head L takes out tested devices 29 from the device testing part E and moves to the position of the unloader buffer carrier 51 and transfers thereto the tested devices 29. Furthermore, the contact head R holding the untested devices 19 moves forward to the device testing part E.

Figure 10F:
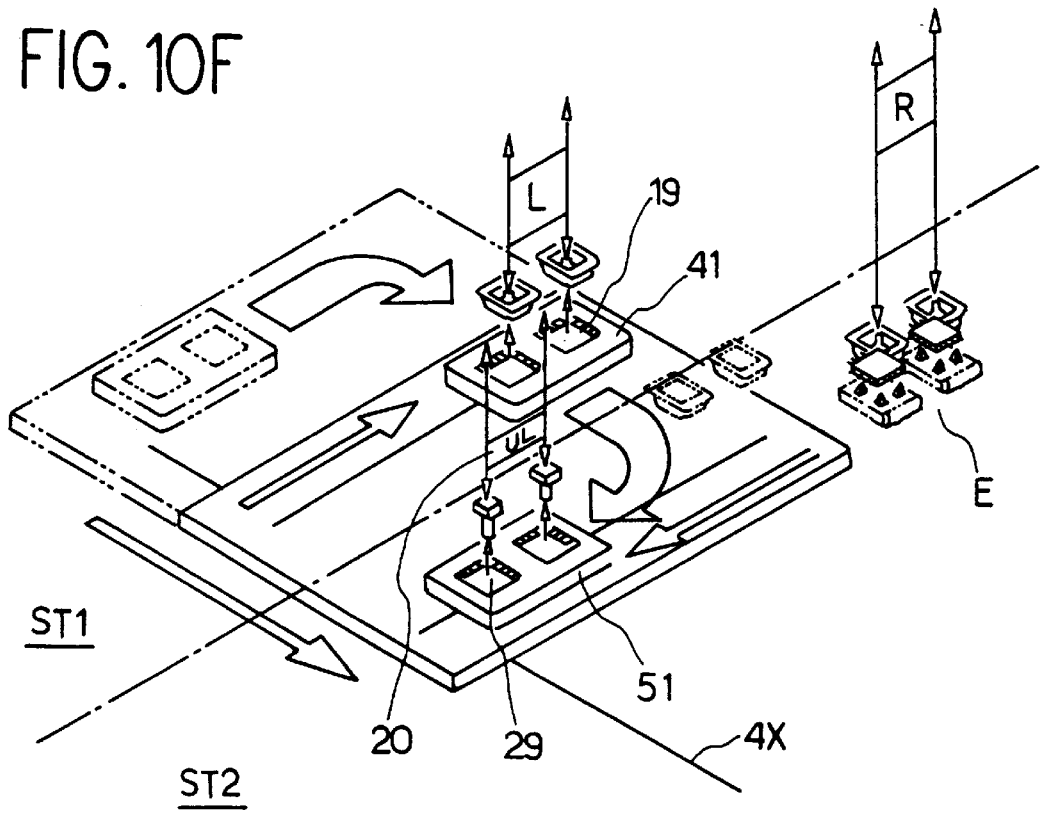
FIG. 10F is a diagram for explaining movements of the loader buffer carrier and the unloader buffer carrier in a sixth state.

In FIG. 10F, the buffer stage ST4 shifts one step in the +X direction and the loader buffer carrier 41 shifts in the +Y direction and transfers the untested devices 19 to the contact head L, while at the same time the contact head R places its retained untested devices 19 in the device testing part E. And the unloader buffer carrier 51, which has the tested devices 29 transferred thereto in FIG. 10E, shifts in the −Y direction and transfers the tested devices 29 to the unloader arm 20.

Figure 10G:
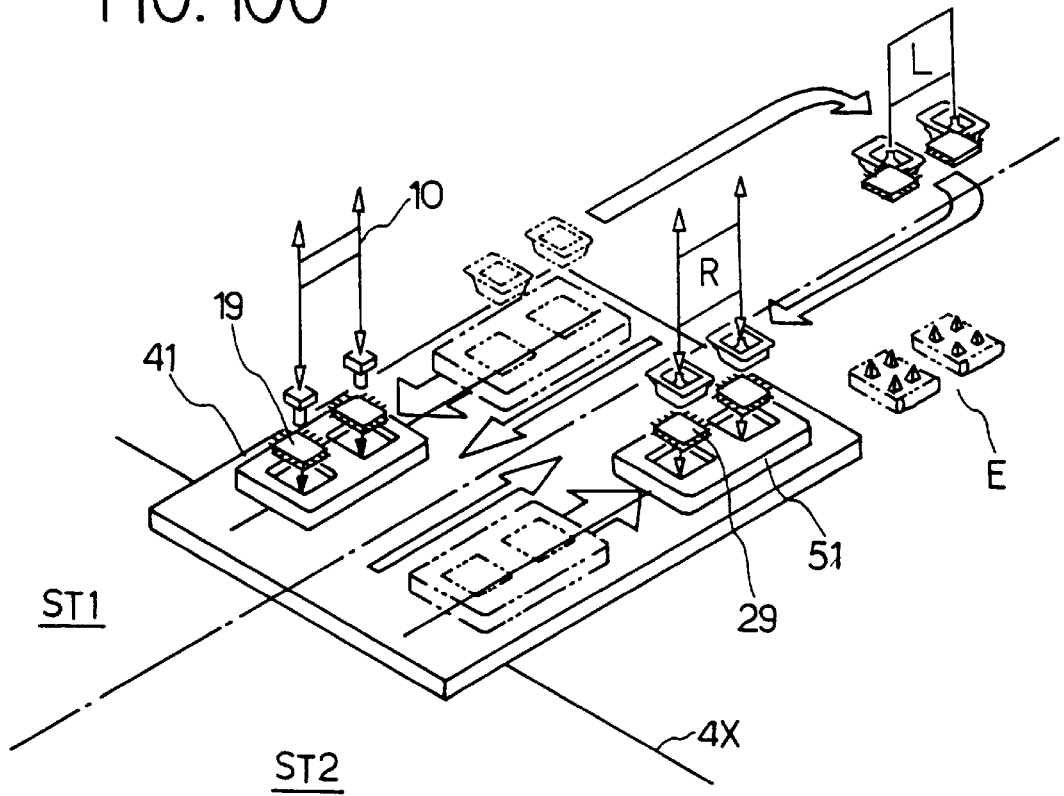
FIG. 10G is a diagram for explaining movements of the loader buffer carrier and the unloader buffer carrier in a seventh state.
Figure 10H:
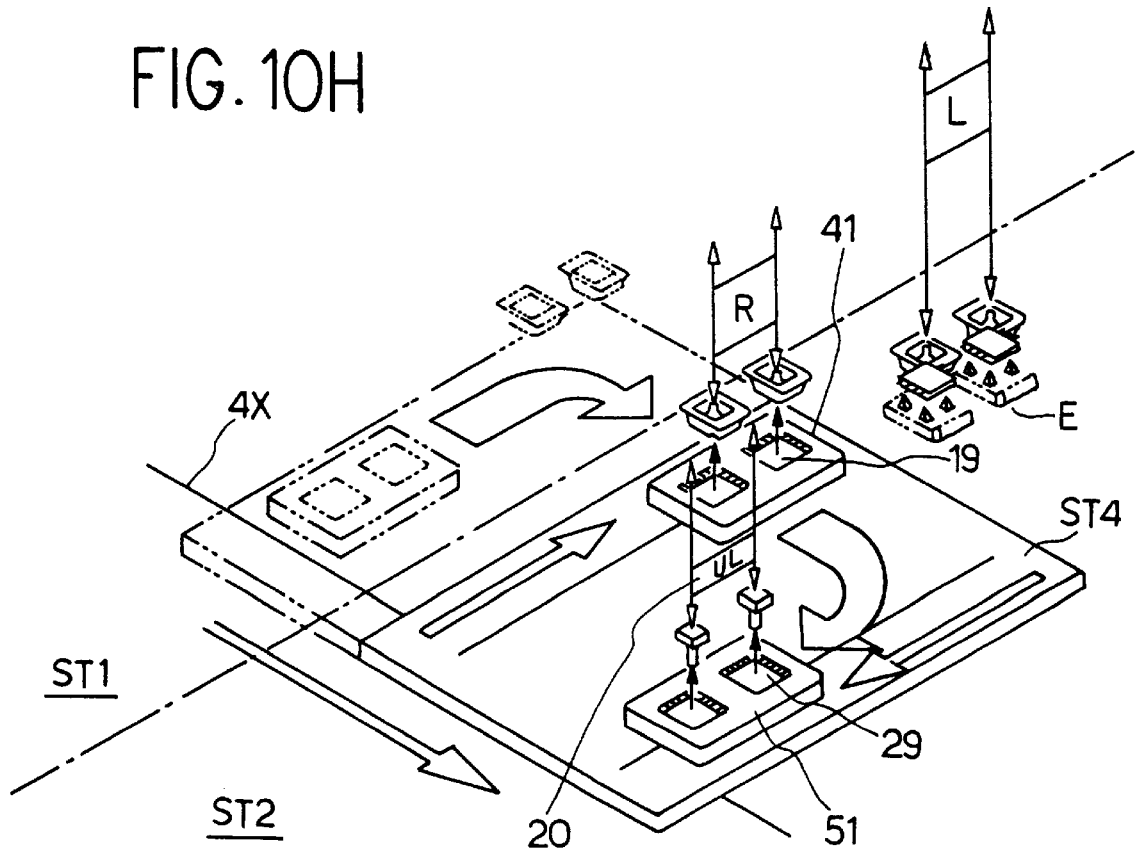
FIG. 10H is a diagram for explaining movements of the loader buffer carrier and the unloader buffer carrier in an eighth state.
Figure 101:
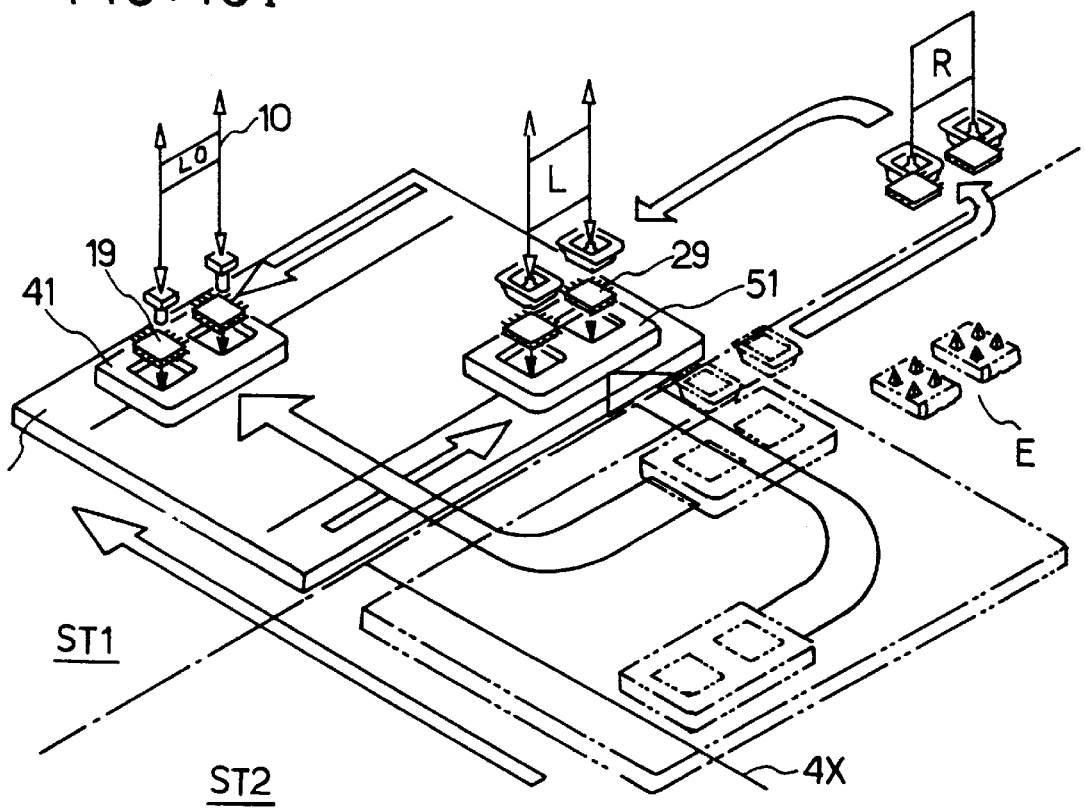

In FIG. 10G, the contact head L holding the untested devices 19 shifts to the device testing part E and the loader buffer carrier 41 moves in the −Y direction back to the original position where to receive the untested devices 19 from the loader arm 10. On the other hand, the unloader buffer carrier 51 moves in the +Y direction back to the original position whereto receive the tested devices 29 from the contact head R the contact head R returns from the device testing part E to the position where to transfer the tested devices 29 to the unloader buffer carrier 51.

In FIG. 10I, the buffer stage ST4 moves two steps in the −X direction back to the initial position. This state is the same as the state of FIG. 10E. Thereafter the operations described above with respect to FIGS. 10E to 10H are repeated.

Figure 11:
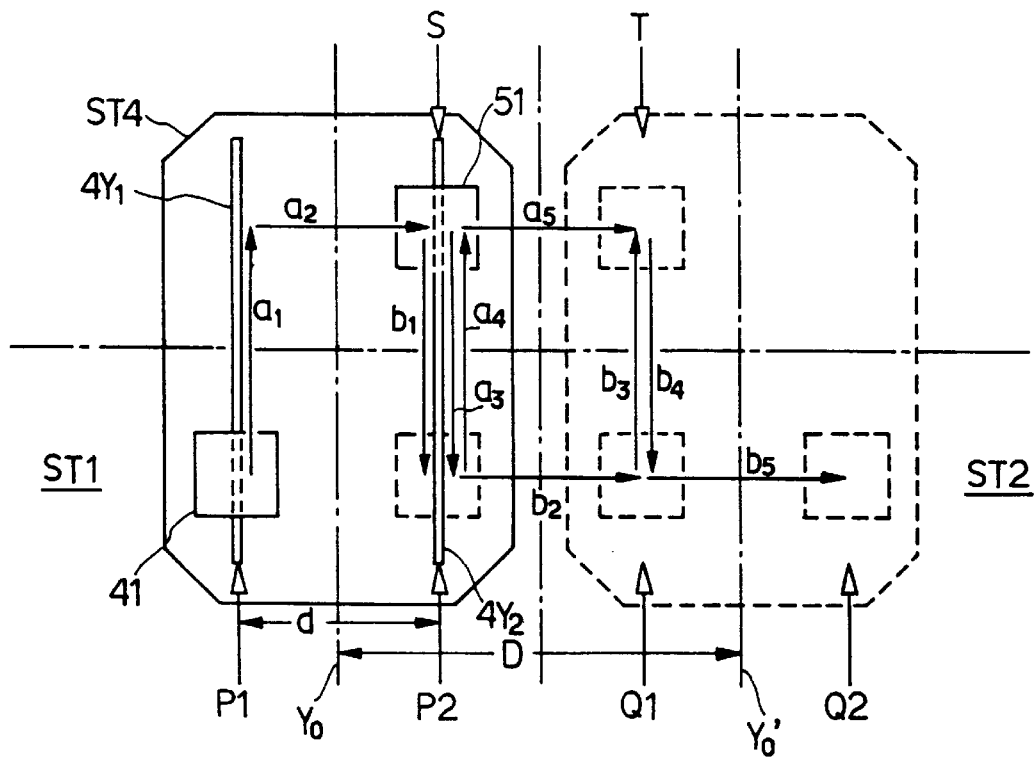
FIG. 11 is a diagram for explaining movements of the buffer stage, the loader buffer carrier and the unloader buffer carrier in the first embodiment in comparison with a third embodiment.
Figure 12:
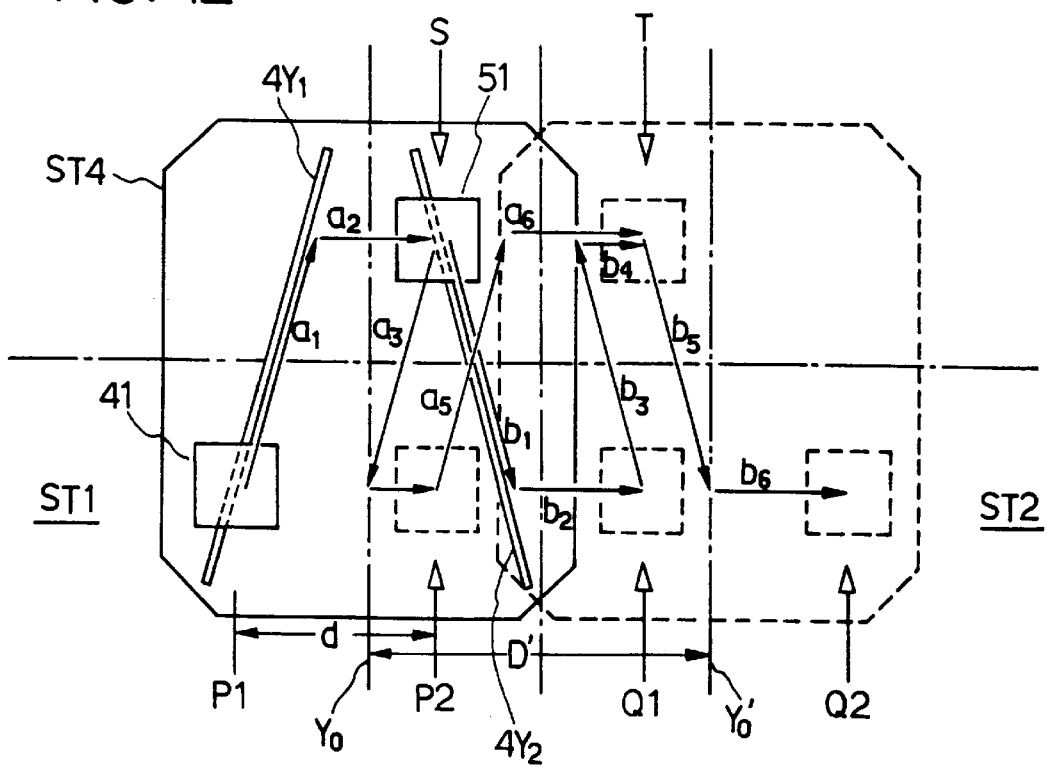
FIG. 12 is a diagram for explaining movements of the buffer stage, the loader buffer carrier and unloader buffer carrier in the third embodiment.

In FIG. 11 there are depicted, in summarized form, X-direction components of travel of the stage ST4 and Y-direction components of travel of the buffer carriers 41 and 51 which represent the movements of the buffer stage ST4 and the loader and unloader buffer carriers 41 and 51 on the Y-direction buffer carrier rails 4Y1 and 4Y2 mounted in parallel on the buffer stage ST4. The arrows $a_1$ to $a_5$ indicate movements of the loader buffer carrier 41 and the arrows $b_1$ to $b_5$ the movements of the unloader buffer carrier 51. These arrows represent the directions of movement and approximate distances of travel. As depicted in FIG. 11, in the above-described embodiment the buffer carriers 41 and 51 move in the Y direction on the parallel Y-direction buffer carrier rails 4Y1 and 4Y2 mounted on the buffer stage ST4. The stage ST4 moves two steps in the +X direction at pitch intervals defined by the positions of the loading and unloading points P1, P2, Q1 and Q2 and then goes back to its initial position (in the −X direction). Accordingly, the total distance of travel of the buffer stage ST4 in this one cycle is $2(a_2+a_5)$. In this example, setting $a_2=a_5=d$, the total distance of travel of the buffer stage ST4 is 4d. The maximum width or range of travel D (the distance between the center lines $Y_0$ and $Y_0'$) of the buffer stage ST4 is 2d. When the total distance of travel 4d of the buffer stage ST4 is large, the time for travel is long correspondingly. To reduce the time for travel, it is necessary to increase the power for driving the buffer stage ST4. In FIG. 12 there is shown, in comparison with the embodiment of FIG. 11, another embodiment of the invention improved in this respect.

In the FIG. 12 embodiment the Y-direction buffer carrier rails $4Y_1$ and $4Y_2$, mounted on the buffer stage ST4 to carry the loader buffer carrier 41 and the unloader buffer carrier 51, are disposed aslant symmetrically with respect to the Y-direction center line $Y_0$ of the buffer stage ST4 so that their spacing increases as the loading points P1 and Q1 are approached the positions S and P2 are on the center line $Y_0$ and the positions P1 and Q1 are symmetrical with respect to the center line $Y_0$. In this example, too, the distances between the loading points P1 and P2, between the unloading points Q1 and Q2 and between the transfer points S and T are all set at d as is the case with the FIG. 1 embodiment.

The loader buffer carrier 41 receives untested devices at the loading point P1 and the unloader buffer carrier 51 receives tested devices at the transfer point S. Then the buffer carriers 41 and 51 move in opposite directions $(a_1, b_1)$ along the buffer carrier rails $4Y_1$ and $4Y_2$, respectively, and the buffer stage ST4 moves in the X direction $(a_2, b_2)$ to the positions S and Q1. At the position S the loader buffer carrier 41 sends the untested devices to the testing part E, whereas at the position Q1 the unloader buffer carrier 51 (see FIG. 6A)transfers the tested devices to the unloader arm 20. After this, the loader and unloader buffer carriers 41 and 51 move in opposite directions $(a_3, b_3)$ along the Y-direction buffer carrier rails $4Y_1$ and $4Y_2$, respectively, and the buffer stage ST4 moves in the X direction $(a_4, b_4)$. As a result, the loader and unloader buffer carriers 41 and 51 get to the positions P2 and T, respectively, where the former receives untested devices and the latter tested devices. Then the loader and unloader buffer carriers 41 and 51 move in opposite directions $(a_5, b_5)$ along the Y-direction buffer carrier rails $4Y_1$ and $4Y_2$, respectively, and the buffer stage ST4 moves in the X direction $(a_6, b_6)$. Thus the loader and unloader buffer carriers 41 and 51 get to the positions T and Q2, respectively, where the former sends the untested devices to the device testing part E and the latter transfers he tested devices to the unloader arm 20. Following this, the buffer stage ST4 returns to the initial untested device loading position and the loader and unloader buffer carriers 41 and 51 to the positions P1 and S, respectively. This embodiment is identical in construction with the FIG. 5 embodiment in other respects.

With the construction of FIG. 12, since $a_4+a_6=d$, the total distance of travel of the buffer stage ST4 is $2(a_2+a_4+a_6)=2(a_2+d)$. As is evident from FIG. 12, $a_2$ is smaller than d, the total distance of travel of the buffer stage ST4 is shorter than in the case of FIG. 11. Of course, the maximum range of travel $D'=(a_2+d)$ of the buffer stage ST4 is also smaller than in the case of FIG. 11. Accordingly, the one-cycle operation periods of the loader and unloader buffers 41 and 51 can be reduced.

In the embodiment of FIG. 12, setting $a_2=b_2=d$ and $a_4=b_4=0$, the total distance of travel of the buffer stage ST4 becomes the same as in the case of FIG. 11. In this instance, the distance between the points P2 and Q1 is larger than d, and consequently, it is less likely that the loader arm 10 and the unloader arm 20 collide with each other near the points P2 and Q1 in FIG. 5.

Figure 13:
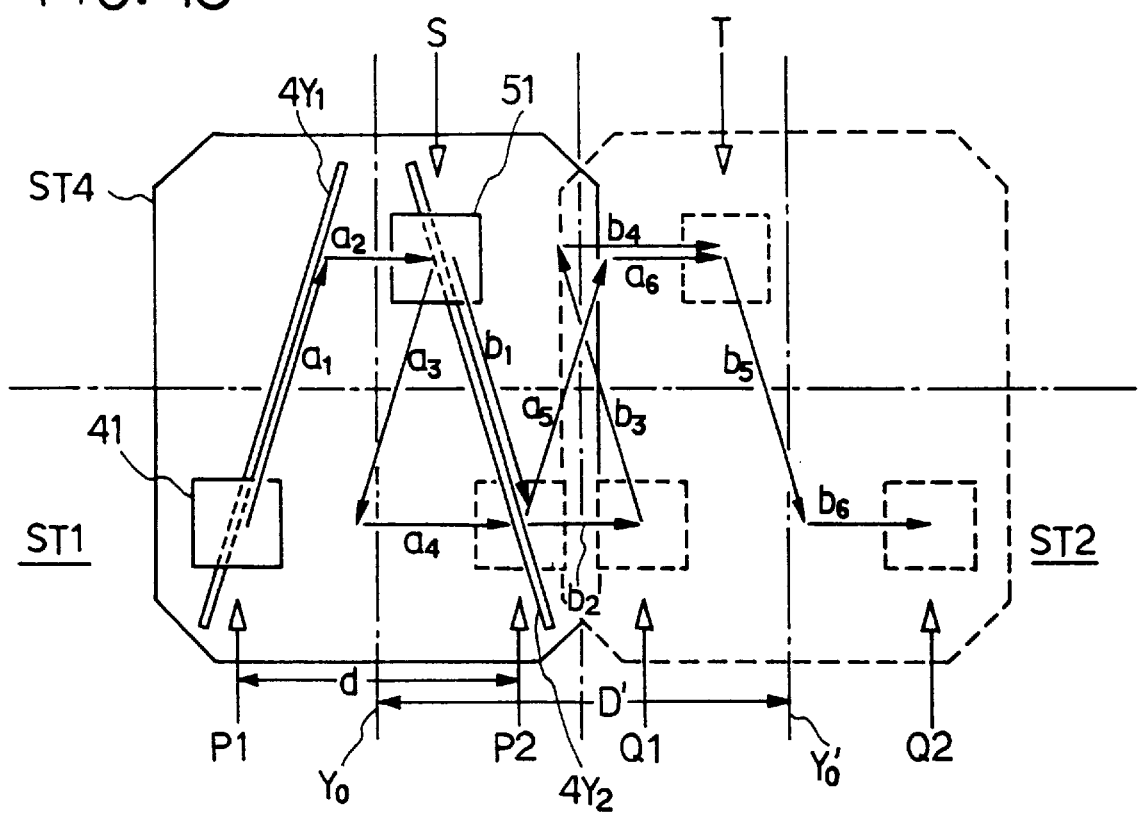
FIG. 13 is a diagram schematically illustrating a modified form of FIG. 12.

While in the FIG. 12 embodiment the points S and P2 are at the same position in the X direction and the points T and Q1 are also at the same position in the X direction, it is possible to make the distance between the points P2 and Q1 shorter than the distance between the points S and T and set the points S and P2 at different positions in the X direction and the points T and Q1 at different positions in the X direction as depicted in FIG. 13. This structure could also produce the same results as those obtainable with the FIG. 12 embodiment. In this instance, too, the total distance of travel of the buffer stage ST4 is $2(a_2+a_4+a_6)$, and setting $a_2+a_4=d$, the distance becomes $2(d+a_6)$. In this case, however, the distance between the points S and T is $b_2+d_4=a_4+a_6=a_2+a_4$; therefore, $a_2=a_6$. Setting $a_2=a_6<d$, the total distance of travel of the buffer stage ST4 is smaller than in the case of FIG. 11.

EFFECT OF THE INVENTION

As described above, according to the present invention, two contact heads are used to transfer devices between the device testing part E and the contact arm operating stage ST3 and the buffer stage ST4 is disposed partly extending over the contact arm operating stage ST3, the loader arm operating stage ST1 and the unloader arm operating stage ST2 to transfer devices between them. The conveyor unit of the loader arm operating stage ST1 conveys only untested devices and the conveyor unit of the unloader arm operating stage ST2 only tested devices. Hence, even if the IC tester stops from operation due to an error in one of the conveyor units or some other part, it can easily be identified from the conveyor unit whether the devices being conveyed are untested or tested devices.

The loader buffer carrier 41 and the unloader buffer carrier 51 are controlled to synchronously move in opposite directions on their Y-direction buffer carrier rails $4Y_1$ and $4Y_2$. The contact heads L and R are also controlled to synchronously move in opposite directions on their Y-direction head carrier rails $3Y_1$ and $3Y_2$. Hence, there is no fear that the both contact heads L and R encounter at the same position where they interfere or collide with each other, resulting in a breakdown of the system.

The Y-direction buffer carrier rails $4Y_1$ and $4Y_2$ for controlling the movements of the loader and unloader buffer carriers 41 and 51 are disposed aslant symmetrically with respect to the Y direction. By this, the amount of travel of the buffer stage ST4 in the X direction can be reduced.

Besides, since the loader arm, the unloader arm and the contact heads L and R are all adapted to handle plural devices, the transfer efficiency can be increased higher than in the case of using one contact arm.

It will be apparent that many modifications and variations may be effected without departing from the scope of the novel concepts of the present invention.

What is claimed is:

1. An IC testing apparatus in which an IC device is conveyed to and tested in an IC device testing part, said apparatus comprising:

a loader arm operating stage;

an unloader arm operating stage;

a contact arm operating stage having first and second contact heads for bringing an IC device in and out of said device testing part and first and second contact head carrier means for controlling movements of said first and second contact heads;

a loader buffer carrier for conveying an untested IC device received from said loader arm operating stage to said contact arm operating stage, said loader arm operating stage having a loader arm for conveying an untested IC device from a tray containing untested IC devices to said loader buffer carrier;

an unloader buffer carrier for conveying a tested IC device received from said contact arm operating stage to said unloader arm operating stage, said unloader arm operating stage having an unloader arm for conveying a tested IC device from said unloader buffer carrier to a tray for receiving tested IC devices;

a buffer stage on which there are spaced apart a Y-direction loader buffer carrier rail for controlling said loader buffer carrier to move between said contact arm operating stage and said loader arm operating stage and a Y-direction unloader buffer carrier rail for controlling said unloader buffer carrier to move between said contact arm operating stage and said unloader arm operating stage; and an X-direction buffer stage rail for controlling said buffer stage to move in the X-direction crossing the direction between said loader arm operating stage and said contact arm operating stage and the direction between said unloader arm operating stage and said contact arm operating stage;

wherein said buffer stage is interposed between said loader arm operating stage, said unloader arm operating stage and said contact arm operating stage.

2. The apparatus of claim 1, wherein: first and second IC device transfer positions are fixed by defined with respect to said contact arm operating stage, and are spaced apart in the X direction so that at least one part of said buffer stage always remains adjacent said IC device testing part; first and second loading positions and first and second unloading positions are spaced apart in said X direction on said loader arm operating stage and said unloader arm operating stage, respectively; and wherein said buffer stage has a first stop position opposite to at least said first IC device transfer position and said first loading position, a second stop position opposite to at least said first IC device transfer position and said first unloading position, and a third stop position opposite to at least said second IC device transfer position and said second unloading position.

3. The apparatus of claim 2, wherein said loader buffer carrier and said unloader buffer carrier are controlled to synchronously move in opposite directions on said Y-direction loader buffer carrier rail and said Y-direction unloader buffer carrier rail, respectively, and wherein said first and second contact heads are controlled to synchronously move on said first and second contact head carrier means in opposite directions.

4. The apparatus of claim 1, wherein said Y direction loader buffer carrier rail for controlling said loader buffer carrier and said Y-direction unloader buffer carrier rail for controlling said unloader buffer carrier are disposed apart on said buffer stage in parallel to each other.

5. The apparatus of claim 1, wherein said Y direction loader buffer carrier rail for controlling said loader buffer carrier and said Y-direction unloader buffer carrier rail for controlling said unloader buffer carrier are disposed aslant symmetrically with respect to said Y direction so that they come closer to each toward said IC device testing part.

6. The apparatus of claim 1, wherein said loader arm, said unloader arm, said first contact head and said second contact head are each adapted to handle a plurality of IC devices at one time.

7. An IC device testing method in which an untested IC device is brought in an IC device testing part and a tested IC device is brought out therefrom, said method comprising the steps of:

(a) conveying an untested IC device by a loader arm on a loader arm operating stage;

(b) receiving and conveying a tested IC device by an unloader arm on an unloader arm operating stage;

(c) controlling first and second contact heads by first and second contact head carrier means to bring IC devices in and out from said IC device testing part by said first and second contact heads;

(d) loading an untested IC device on a loader buffer carrier and conveying it from said loader arm operating stage to a contact arm operating stage;

(e) loading a tested IC device on an unloader buffer carrier and conveying it from said contact arm operating stage to said unloader arm operating stage;

(f) controlling said loader buffer carrier by a Y-direction loader buffer carrier rail, disposed on a buffer stage, to move between said contact arm operating stage and said loader arm operating stage and controlling said unloader buffer carrier by a Y-direction unloader buffer carrier rail, disposed on said buffer stage apart from said Y-direction loader buffer carrier rail, to move between said contact arm operating stage and said unloader arm operating stage; and (g) controlling said buffer stage by an X-direction buffer carrier rail to move in the X direction.

8. The method of claim 7, wherein: first and second IC device transfer positions, fixed with respect to said contact arm operating stage, are spaced apart in the X direction so that at least one part of said buffer stage always remains adjacent said IC device testing part; first and second loading positions and first and second unloading positions are spaced apart in said X direction on said loader arm operating stage and said unloader arm operating stage, respectively; and wherein said buffer stage has a first stop position opposite to at least said first IC device transfer position and said first loading position, a second stop position opposite to at least said first IC device transfer position and said first unloading position, and a third stop position opposite to at least said second IC device transfer position and said second unloading position.

9. The method of claim 8, wherein said loader buffer carrier and said unloader buffer carrier are controlled by said Y-direction loader buffer carrier rail and said Y-direction unloader buffer carrier rail to synchronously move in opposite direction; and wherein first and second contact heads are controlled to synchronously move in opposite directions on said first and second contact head carrier means.

10. The method of claim 9, wherein said step (f) is a step of controlling said loader buffer carrier and said unloader buffer carrier to move in opposite directions along said Y-direction loader buffer carrier rail and said Y-direction unloader buffer carrier rail disposed apart on said buffer stage but in parallel to each other.

11. The method of claim 7, wherein said step (f) is a step of controlling said loader buffer carrier and said unloader buffer carrier to synchronously move in opposite directions along said Y-direction loader buffer carrier rail and said Y-direction unloader buffer carrier rail which are disposed aslant on said buffer stage symmetrically with respect to the Y direction so that they are closer to each other on the side of said IC device testing part.

* * * * *

UNITED STATES PATENT AND TRADEMARK OFFICE
CERTIFICATE OF CORRECTION

PATENT NO.: 6,031,384
DATED : February 29, 2000
INVENTOR(S): Katsunobu FURUTA

It is certified that errors appear in the above-identified patent and that said Letters Patent is hereby corrected as shown below:

Col. 1, line 35, change "1x" to --1X--.
Col. 2, line 37, change "3z" to --3Z--.
Col. 3, line 20, change "3z" to --3Z--.
Col. 4, line 16, change "f or" to --for--.
Col. 6, line 48, change "trasfer" to --transfer--.
Col. 7, line 29, change "AT" to --At--.
Col. 8, line 36, insert --.-- after "approached".
Col. 8, line 36, change "the" to --The-- (first occurrence)

Signed and Sealed this

Third Day of April, 2001

*Attest:*

NICHOLAS P. GODICI

*Attesting Officer*  *Acting Director of the United States Patent and Trademark Office*